US005110793A

United States Patent [19]

De

[11] Patent Number: 5,110,793

[45] Date of Patent: May 5, 1992

[54] ULTRA HIGH ENERGY CAPACITORS USING INTENSE MAGNETIC FIELD INSULATION PRODUCED BY HIGH-$T_c$ SUPERCONDUCTING ELEMENTS FOR ELECTRICAL ENERGY STORAGE AND PULSED POWER APPLICATIONS

[75] Inventor: Dilip K. De, Winston-Salem, N.C.

[73] Assignee: International Superconductor Corp., Riverdale, N.Y.

[21] Appl. No.: 314,432

[22] Filed: Feb. 22, 1989

[51] Int. Cl.⁵ ...................... H01F 36/00; G11C 11/44

[52] U.S. Cl. ........................................ 505/869; 320/1

[58] Field of Search .................. 320/1; 361/321, 276 361/326; 505/869; 252/52

[56] References Cited

U.S. PATENT DOCUMENTS

| | | | |
|---|---|---|---|
| 3,701,906 | 10/1972 | Denel et al. | 505/869 X |
| 4,082,991 | 4/1978 | Constant | 320/1 |
| 4,414,461 | 11/1983 | Wolf | 505/869 X |
| 4,599,677 | 7/1986 | Lawless et al. | 252/521 X |

*Primary Examiner*—R. J. Hickey
*Attorney, Agent, or Firm*—Herbert Dubno

[57] ABSTRACT

High-critical-temperature superconducting materials produce a magnetic field which acts as an electric field insulation, and as a substitute for dielectrics, so as to store high electrical voltage and high electrical energy, thereby eliminating the need of insulating dielectrics capacitors so as to make the energy source light and compact, and very suitable for storage of electrical energy, as a one-stage electron accelerator and/or for pulsed power applications.

20 Claims, 4 Drawing Sheets

ULTRA HIGH ENERGY CAPACITORS USING INTENSE MAGNETIC FIELD INSULATION PRODUCED BY HIGH-$T_c$ SUPERCONDUCTING ELEMENTS FOR ELECTRICAL ENERGY STORAGE AND PULSED POWER APPLICATIONS

FIELD OF INVENTION

This invention relates to the utilization of high critical temperature superconducting materials to produce permanent high magnetic fields which can provide an excellent insulation, so as to store ultra high electrical energy for long periods of time in a compact volume and use it upon demand.

BACKGROUND OF INVENTION

Knowledge of ceramic superconducting compositions is of recent origin. Superconductivity itself was discovered by the Dutch scientist Heike Onnes in 1911 while he was studying the electrical properties of mercury at very low temperatures. In more recent times, Ogg (1946) observed superconductivity in ammonia solutions and proposed that superconductivity arose in these quenched metal-ammonia solutions because of mobile electron pairs. About 1973, it was determined that niobium metal and its alloys exhibited superconductivity when cooled to liquid helium (~4 K) temperatures. Later results raised this temperature as high as $23^K$ (−250° C.). Until recently, it was believed that this temperature represented a barrier and that superconductivity above this point was not possible. This conviction was based on the theoretical work of Bardeen, Cooper and Schieffer (BCS theory—1946) which predicted such a limit. In the early 1970's, several theoretical proposals suggested that the critical temperature for superconductivity could indeed be increased. These included V. L. Ginzberg, Usp. Fiz. Nauk., 101 185 (1970), and D. Allender, J. Bray, & J. Bardeen, Phys. Rev. B8, 4433 (1973). However, the lack of any revelations of superconductivity above $23^K$ augmented the belief that indeed this temperature could not be exceeded. In December 1986, Bednorz and Mller announced the discovery (G. Bednorz and A. Mller, Z. Phys., B64 189 (1986)) of a new ceramic superconducting compound based on lanthanum, barium, and copper oxides, whose critical temperature for superconductivity was close to 35 K. By the following month, the critical temperature, $T_c$, for the onset of superconductivity was raised to nearly 80° K. by Chu and coworkers (M. K. Wu, J. R. Ashburn, C. J. Tang, P. H. Hor, R. L. Meng, L. Gao, Z. J. Huang, Y. Q. Wang and C. W. Chu, Phys. Rev. Lett. 58 908 (1987)). This was achieved by changing the composition to yttrium barium copper oxide, approximated by the formula:

$$Y_{1.0}Ba_{1.8}Cu_{3.0}O_{6.3}$$

This formula, determined experimentally, is not exactly stoichiometric. It is believed that the lack of specific stoichiometry contributes most to the onset of superconductivity. Nevertheless, the exact mechanisms connecting superconductivity with chemical composition and stoichiometry are not completely coherent, even though they are receiving intensive study at this time. The most recent superconducting ceramic compositions announced to date include:

Bismuth Strontium Calcium Copper Oxide:

$$Bi_2Sr_{3-x}Ca_xCu_2O_{8+y}$$

$$T_c = 114^K.$$

Thallium Calcium (Barium) Copper Oxide:

| |
|---|
| $Tl\ Ba_2\ Ca\ Cu_2\ O_7$ |
| $Tl\ Ba_2\ Ca_2\ Cu_3\ O_9$ |
| $Tl\ Ba_2\ Ca_3\ Cu_4\ O_{11}$ |
| $Tl\ Ba_2\ Ca_4\ Cu_5\ O_{13}$ |
| $T_c$ = 120 K. |

The main advantage to superconducting compositions with higher $T_c$ (critical temperature for change from semiconductor to superconductor) values is that they should perform better, i.e.—carry higher currents, when cooled to liquid nitrogen temperatures ( 78 K.).

Another recently announced superconducting ceramic is based on a copper-free composition, vis:

$$BaO—K2O—Bi_2O_3$$

This compound becomes superconducting at about 30 K. While copper-oxide superconductors exhibit layered structures (see below) that carry current efficiently only along certain planes, this new material is a three-dimensional network of bismuth and oxygen with properties that are much less sensitive to crystallographic direction.

The mechanism of superconductivity in such oxide-based ceramic materials is not at all well understood. Ogg's original contribution suggested that superconductivity arose in quenched metal-ammonia solutions because of mobile electron pairs. The concept accepted at present is similar (the BCS theory), and suggests that if a mobile electron propagates through a lattice structure, it will normally interact with the bound electrons of the lattice because of differences in the electron quantum-spin number. However, if two such electrons form a pair which are bound through opposite spin-pairing (Cooper pairs), then no quantum interaction of the bound pairs can occur with the electrons of the lattice (which still have an electron moment). That the BCS theory has some validity is shown by the following consideration. The so-called 1:2:3 compound, composed of Y-Ba-Cu-O atoms, is prepared by the solid state reaction of the requisite oxides, vis:

$$2Y_2O_3+4BaO+6CuO+5O_2=4YBa_2Cu_3O_{6.5}.$$

It is now established (C. N. Rao et al, Nature, 327 185 (1987)) that high $T_c$ superconductivity in the Y-Ba-Cu-O system originates from a compound of stoichiometry: $YBa_2Cu_3O_{7-x}$, where "x" is a value less than 1.0. This compound has the structure of the ideal perovskite, $YBa_2Cu_3O_9$. Thus, the superconductor—$YBa_2Cu_3O_7$ has about 25% fewer oxygen atoms present in the lattice as compared to the idealized cubic perovskite structure. This massive oxygen deficiency means that instead of the conventional three-dimensional crystalline cubic-stacking array of the perovskite, a unique layered structure results. A loss of even more oxygen atoms in this structure gives rise to the semiconductor, $YBa_2Cu_3O_6$. The chain of copper atoms associated with a chain of oxygen atoms is believed to be the key to superconducting behavior. The apparent oxidation state of the copper atoms is above $2^+$ but below $3^+$. Yet the above description is an idealized one. The actual distinct charge and structural conformation of the copper-oxygen layers has not yet been specifically delineated. Note that there appear to be extra oxygen atoms in the superconducting unit cell, compared to that of the semiconductor.

The details of processing such ceramics are also important. The compounds are extremely sensitive to small differences in thermal treatment and it is difficult to obtain two samples of the same (presumably) composition having identical electrical properties. Each individual particle of the powder so-produced has microscopic grains within each crystal composing the powder. Each grain is essentially single-crystal but is joined in random orientation to each of its neighbors. This alone reduces the current-carrying capacity by a factor of perhaps 100. In addition, each grain boundary is a poor conductor. But low current capacity is not the only problem. The ceramic is brittle, due in part to the randomly oriented grains, and it will deteriorate when exposed to water vapor. In addition, purity of the raw materials used is also a problem, since inclusion of even parts per billion of an impurity would cause formation of a non-superconducting composition on a microscopic scale within a given grain. Another problem with bulk (powder) materials is that the crystalline structure is layered (see above). It is suspected that current prefers to flow within the layers and that superconductivity breaks down in the direction perpendicular to those planes. If the layers could be coaxed into favored orientation, such a wire or strand could, in theory, carry much higher current densities.

Superconducting compositions are usually prepared by calcining carefully formulated mixtures of oxides. For example, to prepare the $YBa_2Cu_3O_{6.3}$ superconducting phase, one weighs out 0.5 mol of $Y_2O_3$, 2.0 mol of BaO, 3.0 mol of CuO, and mixes them thoroughly. The mixture is then calcined at elevated temperature in an oxygen-containing atmosphere whereupon the oxides undergo solid state reaction to form a single phase with superconducting properties at 78 K. Alternatively, one can choose compounds which decompose to form oxides which react to form the desired phase, when heated to elevated temperature.

Once the powder has been prepared, it can be handled by conventional means and processed to desirable forms. One such method employs a slurry of powder and methanol. By casting a uniform film on a suitable substrate such as sapphire, one can dry it, calcine it, and obtain a dense, uniform layer possessing superconducting properties. A micro- circuit can be etched in the film by laser ablation to obtain desired designs. However, this step mandates a reannealing step in oxygen atmosphere to restore the critical oxide stoichiometry required for superconductivity.

Another method to prepare a superconducting film, particularly for use, on a silicon substrate as an integrated circuit, has been to deposit thin layers of the appropriate metal oxides in specific order by electron-beam evaporation. Copper is first deposited, then barium, and then yttrium, all as oxides. The sequence is repeated 6-times to obtain an "18-layer" stack of the three ingredients having a total thickness of 0.6–0.7 microns. To complete the process, the specimens are then annealed in oxygen atmosphere for five minutes and then cooled at a rate of about 120° C. per hour. It was necessary to deposit a buffer layer of inert zirconia on the silicon substrate, before the oxides were deposited, in order to prevent the oxides from reacting with the silicon substrate before the superconducting composition formed. The annealing step was shown to be extremely critical since the oxygen content in the film must be precisely maintained within certain (unknown) limits for the superconductivity state to prevail.

In a method using electron-beam evaporation, the new thallium-based compositions were deposited in films in sequential order under a partial oxygen pressure. The film was then subjected to two partial annealing steps because the thallium content must be carefully controlled. Such films were able to carry a current of about 110,000 A./cm². They were deposited on several substrata, including sapphire, strontium titanate and silicon.

Another approach to preparation of superconducting films has been to employ compounds which are volatile and to cause them to decompose on a hot surface in a partial vacuum. This method, known as vapor phase epitaxy, is well suited for the preparation of integrated circuits on a silicon substrate and is capable of producing a superconductive monocrystalline film, using halogen compounds (or others) as the source materials, provided that suitable annealing in an oxygen atmosphere is carried out.

Still another method for preparing superconductors in useful form has been the formation of the ceramic composition by heating together specific mixtures of oxides. Once the superconducting composition had been formed, it was compacted into a bar. Said bar was then heated on a pedestal by a LASER until it melted, a seed crystal was added, and a fiber was drawn at a controlled rate. The prototype wire was able to carry 30,000 A/cm² at 4 xK. before it failed. The composition used, $Bi_2Sr_{3-x}Ca_x\ Cu_2O_{8+y}$, was sintered, then reground and sintered again at least two more times, to achieve a uniform composition. The fiber so-produced was a single crystal but was subject to the shortcomings of all ceramic fibers, namely flexibility and ductility.

Another method to form a superconducting film has been to prepare a superconducting powder of $Y_{1.0}Ba_{1.8}Cu_{3.0}O_{7-x}$ composition, using conventional means. The initial preparation was checked for superconducting properties by measuring a pressed and sintered pellet. Once the material was found to have the desired properties, a powder slurry was made and the slurry was applied with a spin coater. The layer was dried and then fired in an oxygen atmosphere. Best films were obtained when fired at 940°–1000° C. If sapphire was used as the substrate, the adherence was such that the films could be ground and polished. One could then etch the film with a laser to obtain a desired geometry of superconducting lines, similar to those of a printed circuit.

All of the above methods and compositions given above for producing superconducting materials and forms are limited in the form of the superconductor that they are able to produce. For example, the electron-beam evaporation method or the vapor phase epitaxial growth method can only produce thin films which are superconductive at 78 K. Even the method which employs laser-melting of a ceramic bar to form a single crystal fiber has its limitations of size and form. The slurry method can produce a facsimile of an integrated circuit, but only if great effort is expended. None of the above methods can be adapted to the storage of energy for long periods of time.

OBJECTS OF THE INVENTION

In contrast, I have found that the use of flexible high-$T_c$ superconductor wires in the form of a coil, coupled with capacitor plates, can be employed as a light weight energy source of high capacity. Furthermore, I have found that high voltages can be sustained, depending on the magnetic field strength generated, and that high electrical energy can be stored without the need of insulating materials having high dielectric strength. Among the many advantages of my new invention is the ability to store large amounts of energy for long periods of time, which is available upon demand. Therefore, it is an object of the present invention to provide an apparatus capable of storing large amounts of energy for long periods of time. Another object of the invention is to enable replacement of heavy, large size high energy capacitors in space with lighter weight, compact superconducting coils coupled to open capacitor plates. Still another object is to provide magnetic fields generated by superconducting apparatus and designs which act as insulators in high vacuum to prevent electrical discharge or breakdown. A final object of the invention is to provide light weight energy sources suitable for pulsed power applications and space deployment.

SUMMARY OF THE INVENTION

A high energy storage device, having a magnetic field of the order of 10 Tesla, is constructed in the form of a solenoid, using wire formed from high-$T_c$ superconducting ceramic materials. The overall apparatus includes a pair of electrically and magnetically shielded plates, which form a capacitor. The said high-temperature superconducting-solenoid can then be used repeatedly to charge high electrical energy to the capacitor, and discharge this energy upon demand. The device is useful in space as a very high energy source and in electrical generating systems as a long term energy storage device, also for use in one stage electron accelerator and other pulsed power applications.

PREFERRED EMBODIMENTS OF THE INVENTION This invention takes the advantage of persistent nature of the magnetic field produced by a superconducting coil.

High-$T_c$ superconductors of rare earth alkaline-earth copper oxides and mixed alkaline-earth copper oxide systems have been known since 1987. Flexible high-$T_c$ superconducting wires, thin films and thin film microstrip lines for advanced electronics have been fabricated out of these ceramic oxide systems. These ceramic oxide superconductors have a very high critical field on the order of 100 Tesla and magnetic fields on the order of 1–10 Tesla can be easily generated by said high-$T_c$ superconductors in flexible form such as wires and tubes. I have determined that in high vacuum, these magnetic fields, which are perpendicular to the electrical field, act as excellent insulators to prevent electrical discharge or breakdown, which otherwise starts from microprotrusions or defects or sharp edges in the capacitor plates or spheres. Furthermore, I have found that high voltages can be sustained, depending on magnetic field strength generated, and that high electrical energy can be stored without the need of insulating materials with high dielectric constant. This reduces the mass and weight of high energy capacitors. These light mass capacitors are suited for pulsed power applications and/or one-stage electron accelerators. Because of their light mass and compact size, the said devices are easier to deploy in space.

BRIEF DESCRIPTION OF THE DRAWING

The above objects, features and advantages of my invention will become more readily apparent from the following description, reference being made to the accompanying drawing in which.

SPECIFIC DESCRIPTION

Figure 1B:
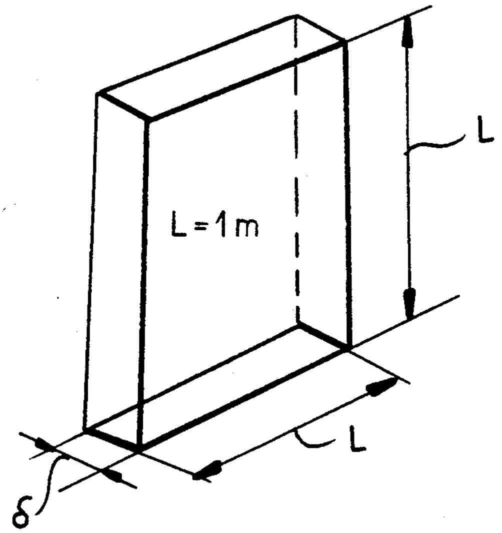
FIG. 1*b* is a perspective view of a capacitor plate as used in this apparatus.
Figure 1A:
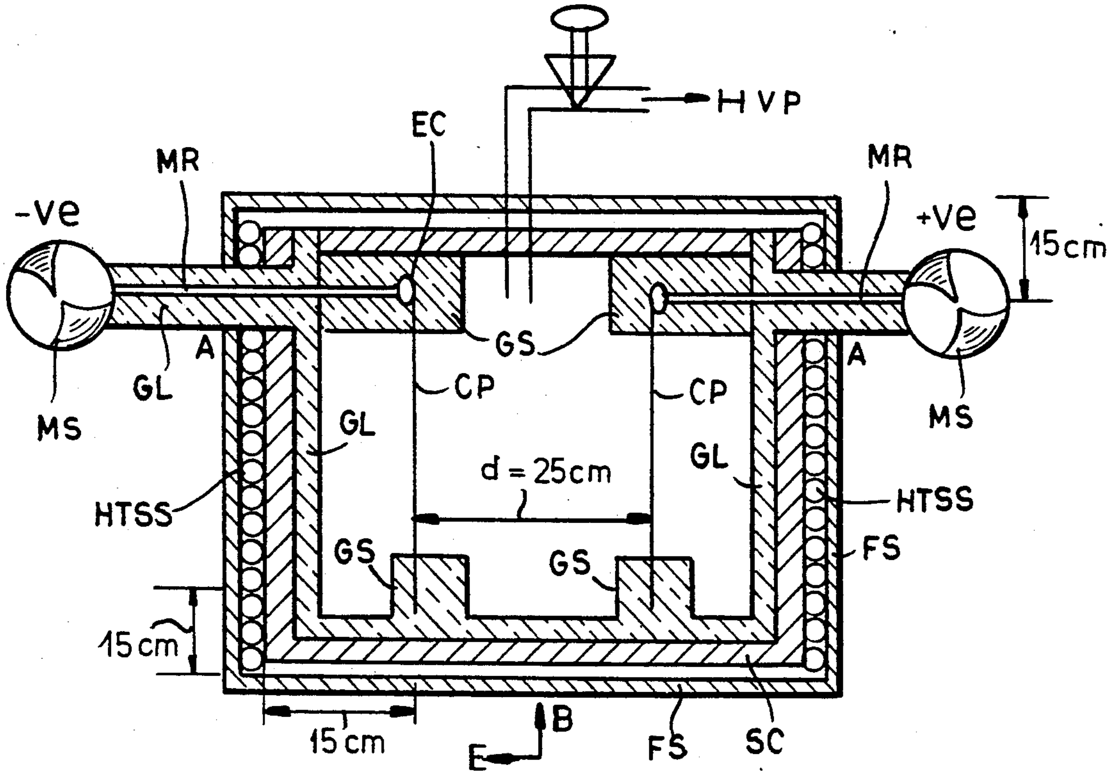
FIG. 1*a* is a cross-sectional view of an apparatus for storing electrical energy by using a magnetic field insulation produced by superconductors.
Figure 3:
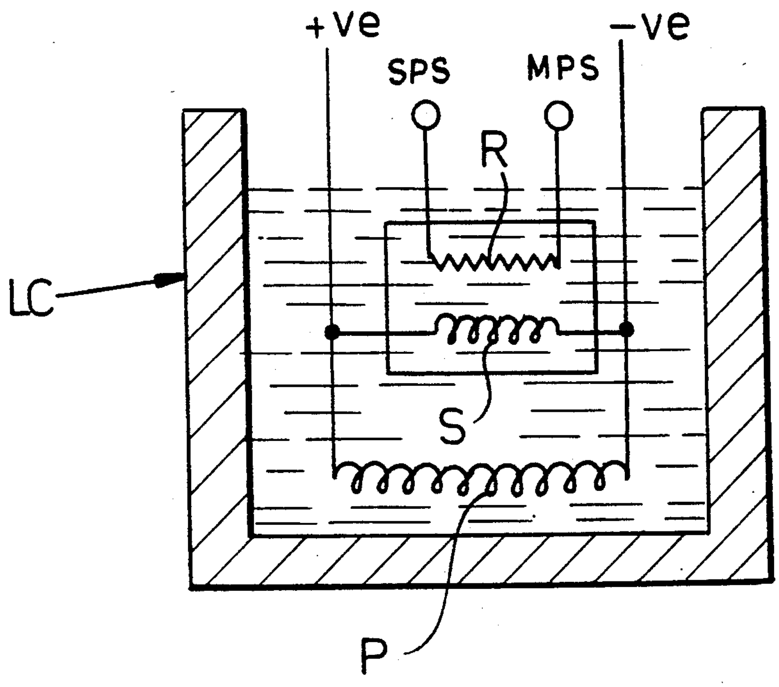
FIG. 3 is a cross-sectional view of a superconducting switch for use with such an apparatus.

FIG. 1*a* depicts a high energy-high voltage capacitor using my new technique of magnetic field insulation. A high magnetic field of the order of 10 Tesla is generated by the high temperature superconducting solenoid (HTSS) which forms the basis of the device. It is essential that this solenoid is made of flexible high-$T_c$ superconducting wire which is manufactured from materials whose critical magnetic field $Hc_2$ is much higher than the magnetic field strength of 10 Tesla which it generates. After the field is established in the coil by by a superconducting switch as in the art, I have found that no power supply is needed to store the magnetic field in the high-temperature superconducting-solenoid. A typical high-$T_c$ superconducting switch (the basic structure is in the art) is shown in FIG. 3. Note that only liquid $N_2$ is necessary because the critical temperature of the superconducting elements is in the range 90–120 K depending on type of ceramics used (see prior discussion). In FIG. 3, the switch is combination of a small size-high-$T_c$ superconducting coil S and a resistor heater. Coil S is connected parallel to the coil P which is the same as the main field coil HTSS of FIG. 1*a*. These are connected to the main power supply and immersed only in liquid nitrogen. To establish currents in coil change P, the resistive heater is turned on until coil S becomes normal with a resistance of several ohms. Voltage then develops across coil S and establishes current and hence magnetic field in coil P. When the desired magnetic field is reached, the resistor is turned off and electrical current then circulates through coils P and S in a persistent mode. Note that a similar switch device employing $Nb_3Sn$ or NbTi superconductors already exist in the art, but that requires expensive liquid helium. In the present device one need only use liquid nitrogen on earth and no cryogen in space. The high-temperature superconducting-solenoid can then be used repeatedly to charge high electrical energy to the capacitor. To prevent the high-temperature superconducting-solenoid from being affected by the instantaneous high-intensity magnetic field that is generated during fast high-power pulses of stored electrical energy released, the whole structure is encased within ferromagnetic shielding (usually mu-metal), denoted by FS, in the form of a metal sphere, MS. There are also two capacitor plates (CP) rigidly held by insulating glass supports, denoted by GS. MR is the metal rod connecting the capacitor plates (CP) and the final terminals pass through the said metal sphere, MS. ROD MR is enclosed entirely in insulating glass. The said terminals are metal-glass joints and are vacuum proof. For improved performance, sphere MS and rod MR may also be embedded within a magnetic field. Such an arrangement is not shown in the drawing. The capacitor plates are enclosed in the steel chamber (SC) that may be rectangular or cylindrical as shown in FIG. 1 which is lined on the inside with glass or epoxy glass materials that do not discharge gas in high vacuum. The entire capacitor plate structure is under high vacuum, and is evacuated by means of the high vacuum pump system HVP. The plates are made of aluminum to minimize the mass of the whole structure. Once a high vacuum of about $10^{-9}$ to $10^{-10}$ torr is reached and the vacuum has stabilized, the whole apparatus may be disconnected from the pump system. The high-$T_c$ superconducting coil is wrapped around the steel chamber and fixed with high thermal conductivity (electrically insulating) epoxy resins. Current in the superconducting coil is generated by a by a high-$T_c$ superconducting switch. This method is already known in the prior art. The high-temperature superconducting-solenoid then produces a magnetic field whose direction is perpendicular to the electrical field of the charged capacitor plates CP. The plates can be charged to a very high voltage (a maximum limit of 520 MV is possible with a magnetic insulation of 10 Tesla) by connecting the metal spheres (MS) to a Vandergraff generator. The discharge of high electrical energy is accomplished by connecting the two metal spheres directly to the device which is to use the pulsed power. When discharge of electrical power is not necessary, the metal spheres MS can be disconnected from the connecting rod MR.

As illustrated in FIG. 1*a*, the inner lining of glass GL and glass support GS of capacitor plates CP serve a dual purpose. One is to electrically insulate the capacitor plates from the outer steel chamber SC. Secondly, glass does not out-gas in high vacuum. Once high vacuum is reached, the pumps are disconnected from the system. FIG. 1*b* illustrates the ideal shape of the capacitor plates CP. I have established that the sharp edges of the plates need to be polished, smoothed and shaped so that electrical breakdown due to field emission from sharp corners is reduced to a minimum. Furthermore, it should be obvious to those skilled in the art that the use of a very high magnetic field in a high vacuum will prevent any electrical breakdown as long as the main electrical field is less than the field emission value of the metals comprisong the capacitor plates and the magnetic lines of forces are normal to the electrical lines of force.

With reference to the accompanying drawings, the relation between electrical field E and magnetic field H, which can insulate the electrical field and thus prevent electrical breakdown in high vacuum, is given by the equation: $E=0.7$ H, where E is in electrostatic units and H is the magnetic field in gauss. For example, a magnetic field of X Tesla would insulate (i.e., prevent electrical breakdown) and its electric field would have a strength of $\sim 2.1 \times X$ MV/cm (mega volt/cm). If X is 1 (i.e., a field of 1 Tesla) then E is $2.1 \times 10^6$ volt/cm. If X is 10 then E would be $2.1 \times 10^7$ V/cm.

This means that the total energy needed to establish that high magnetic field of 10 Tesla, within the said structure, is at least 10 MJ. I have further established that the advantage of spending 10 MJ of energy on the magnetic field in order to store an electrical energy of 6.3 MJ initially lies in its degree of permanancy. I have found that because of the of the Meissner effect superconductivity phenomena, the magnetic field, if it is below the critical field limit, will remain as long as superconductivity persists in the material. As is well known, this depends on the temperature. High-$T_c$ superconducting materials have $T_c$ values in the ranges 90–120 K. In space, the temperature is always close to 77 K, or below. Therefore, once the magnetic field of the instant invention is established in space, the magnetic field remains indefinitely, until it is quenched. In the design of my new invention, the superconducting solenoid structure, containing the high voltage capacitor structures, is electrically and magnetically insulated from the actual rf pulse power devices. Therefore, there is no instantaneous rise in the magnetic field which could exceed the critical field of the high-$T_c$ material, thereby destroying the superconductivity. I have determined that the stored field can only be destroyed if an instantaneous and very intense magnetic field, or some local heating effect, occurs in the superconducting solenoid structure. The ferromagnetic shielding, FS (FIG. 1*a*), made of high permeability f-metals, prevents the high-temperature superconducting-solenoid from being affected by stray electrical pulses and magnetic fields.

In the accompanying drawings (FIG. 3), I have included illustration of how the high magnetic field of 10 T is established in the high-temperature superconducting-solenoid. This is done by a superconducting switch, or by other suitable techniques already known in the existing art. Metal spheres MS need not be permanently connected to the metal rods MR which are connected to the capacitor plates; however, in FIG. 1*a* it is shown as though they are fixed to the metal rods. The metal spheres are connected to the rods MR by a mechanical device just before the pulsed power applications are desired. The metal spheres and the connecting rods are perfectly smooth and devoid of any micro-protrusions. The contact of the MR with the CP is permanent in this design and is also without any sharp edges or micro-protrusions. The distance d in FIG. 1*a* is 25 cm. The plates are square $1 \times 1$ $m^2$.

In the present invention, the plates are subjected to electrical stress of the compressional type $Fc=19.5 \times 106$ $N/m^2$ which is well below the maximum allowable compressional stress ($200 \times 106$ $N/m^2$) for aluminum (assuming the plates are made of aluminum). There is some stress due to the intense magnetic field because of the diamagnetic susceptibity of aluminum. This, however, is negligible in comparison with those of the electrostatic forces on the capacitor plates. However, the plates are also subjected to shear stress at the edges (see FIG. 1*b*). The total shear force is FcxA/4a, where a is the total end face area. If each of the plates is held at its four end faces and if the plate thickness is $t=a/1$ m (see FIG. 1*a*), where a is the area of each plate, then we can calculate the minimum thickness of the plate required before mechanical rupture occurs by the following equation: $FcA/4(t \times 1\ m)=Ss$, where Ss is the maximum shear stress that the material of the plate would tolerate (aluminum in our case). We keep a safety factor of 3. All dimensions are in SI unit. Thus, t is calculated to be 7.5 cm. This means that two highly polished and smooth aluminum plates 7.5 cm thick, with an area of 1 $m^2$, which are kept rigidly fixed at their end faces in a vacuum on the order of $10^{-9}-10^{-10}$ torr, in an intense magnetic field of 10 T, would be able to store an electrical energy of 6.3 MJ without any electrical breakdown. Such a magnetic field of 10 T could be generated and stored in high-temperature superconducting-solenoid. Because of the nature of high-$T_c$ superconducting solenoid it is not necessary to have an extra cooling system for the high-temperature superconducting-solenoid in space. With 90–120 K high-$T_c$ superconductors, there is high voltage and high energy compact capacitor system which works in space without the need of any cooling arrangements. If the system is to be used on earth, liquid nitrogen, which is inexpensive, is required. Use of liquid nitrogen in proper cryostat is already known in the art and can be easily incorporated for the operation of the device.

In the present invention, to avoid electrical breakdown started by field emission from the edges of the plates where electric field intensity is the greatest, the edges of the aluminum are rounded to avoid any sharp edge. Field emission generally occurs at electric field strength of 10 giga volt/m. The electric field at any point near the edge depends on its curvature and the electric field at any point on the edge of the deice of the instant invention is significantly less than the field emission value. We will not herein address how a possible breakdown from arms AB may be prevented (the electric field there is much less than the very intense field of ~20 MV/cm that exists within the capacitor plates) but it is not difficult to introduce a system that keeps arms AB in a magnetic field, while keeping it in a high vacuum of $10^{-9}$ torr To avoid electrical breakdown due to fringe fields near the edges of the capacitor plates (which are not perpendicular to the magnetic field), the magnetic field near the edges is suitably shaped by computer, so that both the electric and magnetic fields are crossed over most of the area. The technique of magnetic field insulation then operates well and high electrical energy can be stored in a small compact capacitor having light mass. Such high electric field is above the dielectric strength of any known materials and is possible only by combination of high vacuum and high magnetic field applied perpendicularly to the electrical field directions. Such a high magnetic field can only be inexpensively generated by using high-$T_c$ superconducting solenoids or any suitable coil structure.

The designs of FIGS. 1 are followed. The specifications of the metal plates to be employed as capacitor plates are determined as follows. Select two metal plates each with an area of 1 $m^2$ (i.e., $A=1\times 1$ $m^2$) of sufficient thickness to withstand the warpage likely to be encountered when fully charged. In most cases, a thickness of a few cms. is sufficient, depending upon the nature of the metal used. These plates are then separated by a distance of d=25 cm (see FIGS. 1*a* and 1*b*), and are maintained in a high vacuum on the order of $10^{-9}$ torr. The plates are separated from the nearest glass lining (See FIG. 1*a*) by ~15 cm. The glass should be chosen so as to have maximum dielectric strength which is ~400 Kvolt/cm. Ideally as dielectric material I have determined that mica which may dielectric strength as high as 2000 kV/cm should be chosen. The glass lining or placement of mica lining on the interior of the rectangular or cylindraical chamber is necessary to provide sufficient electrical insulation to the outer chamber so that the whole chamber can be handled safely. A combination of glass and mica lining with a layer high vacuum in between may also be designed inside the chamber. Such design would ensure complete electrical insulation of the outer case from the high voltage of the capacitor plates. They are charged to high voltage to maximum field strength permissible by the magnetic field insulation of 10 Tesla (i.e. ~520 MV) (without electrical break down). Such high voltage is easily obtained from a Vandegraff generator by connecting the metal spheres, MS, to the said generator, or any other suitable high voltage source. Once charged, the said plates retain this very high voltage without loss due to electrical breakdown because of the insulation provided by the magnetic field of 10 Tesla, even though they are separated in vacuum only by a distance of 0.25 m. The total energy content of the capacitor is calculated by the equation:

$$W=0.5CV^2=0.5\epsilon_o AV^2/d=6.3\text{ MJ}.$$

The total energy of the system can be increased suitably by any one of the following steps: (i) Increasing the separation of the plates (ii) increasing the area of the plates (iii) In space (where high vacuum is available naturally), for a given total volume, the distance between the plate and the glass lining could be reduced to ~7.5 cm provided.

Because it is necessary to design high-temperature superconducting-solenoid to generate an intense magnetic field of 10 Tesla, the weight of high-temperature superconducting-solenoid is a major factor in determining the overall mass to energy efficiency of the high voltage-high energy storage device. The magnetic field generated may be approximately calculated by the equation:

$$B=\mu_o nI$$

where n=the number of turns in the solenoid per meter, and $\mu_o=12.57\times 10^{-7}$ T/m/A. If we use flexible high-$T_c$ superconducting wire of a cross-section of 1 $cm^2$ carrying a current of 100,000 Amp/$cm^2$, then we need only n=100 to generate a field of 10 Tesla. Thus, in a length of 1.3 meters, we require 130 turns of wire. Each turn then will have an approximate length equal to 4 m or 400 cm (see FIG. 1*a*). The density of the high-$T_c$ superconducting material is now ~6 gm/$cm^3$. The total mass of the high-$T_c$ superconducting solenoid high-temperature superconducting-solenoid is then easily estimated to be 312 kg. In future the ceramic superconductor may be developed having current density 10 times at that quoted. Then the mass of the coil could be reduced to one 10th of 312 Kg i.e., around 30–40 Kg.

It is important to know the weight of the high-$T_c$ superconducting magnet system:

The total mass of the aluminum plates$=2\times 100\times 100\times 7.5\times 2.7$ gms$=405$ kg. This ensures a safety factor of 3.0 on the mechanical disruption of the capacitor plates, due to the imposition of a high electical field.

The steel chamber SC (with a wall 0.75 cm thick) has a mass of $2\times 70\times 130\times 0.75\times 7.8+2\times 130\times 130\times 0.75\times 7.8$ gms$=304.2$ kg. Another 100 kg is added by the glass lining and glass support and mu-metal ferromagnetic shielding.

The total maximum mass of the system is: 1121 kg.—This is the Maximum mass of the system designed to store a magnetic field of 10 tesla and electric field of 21 Mega volt/cm in high vacuum with electrical energy of 4.5 Mega Joules. As mentioned before by improbed high-$T_c$ ceramic superconductor that is capable of carrying current density of 1000000 A/cm$^2$, the mass of the HTSS would be only around 30–40 Kg. If we keep only a safety factor of two in the disruption of aluminum plates then we save another 100 Kg in mass. Moreover by efficient engineering (construction of steel chamber, mu-metal shielding, glass supports etc) a further reduction in overall mass by 100 Kg can be achieved. Therefore the minimum mass of the system with above mentioned performance capability would be around 751 kg. It should be noted that the system has maximum magnetic energy of (in the form of persistent superconducting magnetic field) 47.32 Mega joules (calculated by total volume x magnetic energy density($E_M$). $E_M$ is of the order of 40 M Joules/m$^3$ at 10 Tesla field). The minimum electrical field energy is of the order of 6.3 M Joules. This electrical energy can be used and stored repeated with the same persistent magnetic field energy. The technology which is already known in the art to construct conventional superconducting magnet would be adapted also to design the HTSS coil in FIG. 1A. For example they should be fixed with high thermal conductivity epoxy as in the art. Provisions should also be made to bypass the shield current.

Figure 4:
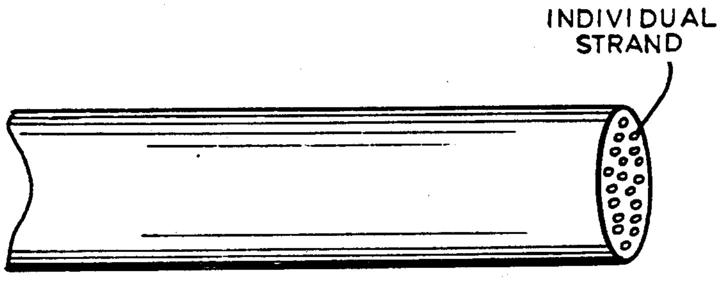
FIG. 4 is a diagrammatic perspective view of a superconducting wire for use in such an apparatus of the invention.
Figure 5:
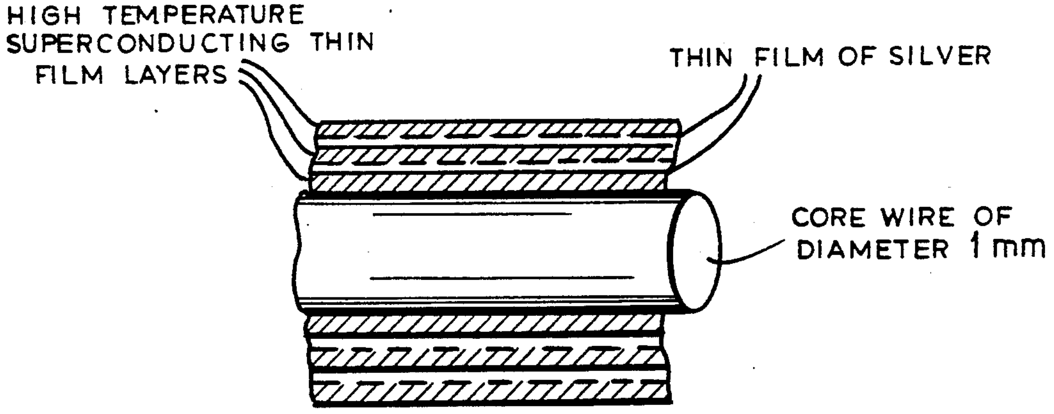
FIG. 5 is a diagrammatic section through another superconducting wire for this purpose.

In the case of magnets to be made of flexible high-temperature superconducting wires, the wires should be a compact bundle (FIG. 4) of fine superconducting filaments which individually would have a composite coatingng of high-$T_c$ superconducting thin film- Silver film (see FIG. 5). The total high-$T_c$ thin film coating around the core conducting wires of diameter 0.5–1 mm would be around 5–10 micron thick. Each layer of high-$T_c$ superconducting thin film would be about 2000–3000 angstroms. The silver layer would be about 500–1000 Å. This would mean a current density of the order of 4000 Amp/cm$^2$. Since the present high-$T_c$ superconductors are capable of carraying current density $\sim 10^5$–$10^6$ amp/cm$^2$, 10 amps current through the said individual high-$T_c$ superconducting filament wires would remain well below the critical limit. 100–500 such filaments can be compacted into The high-$T_c$ ceramic superconductors have good flux pinning centers and flux flow can be prevented easily by above mentioned composite layered structures (FIG. 5). The said silver layer will also provide a bypass for the shield current that may be generated in one superconducting wire due to the magnetic fields produced by the other superconducting wires. Also current crossing from one superconducting line to the next superconducting line can probably be avoided by such design.

Figure 2:
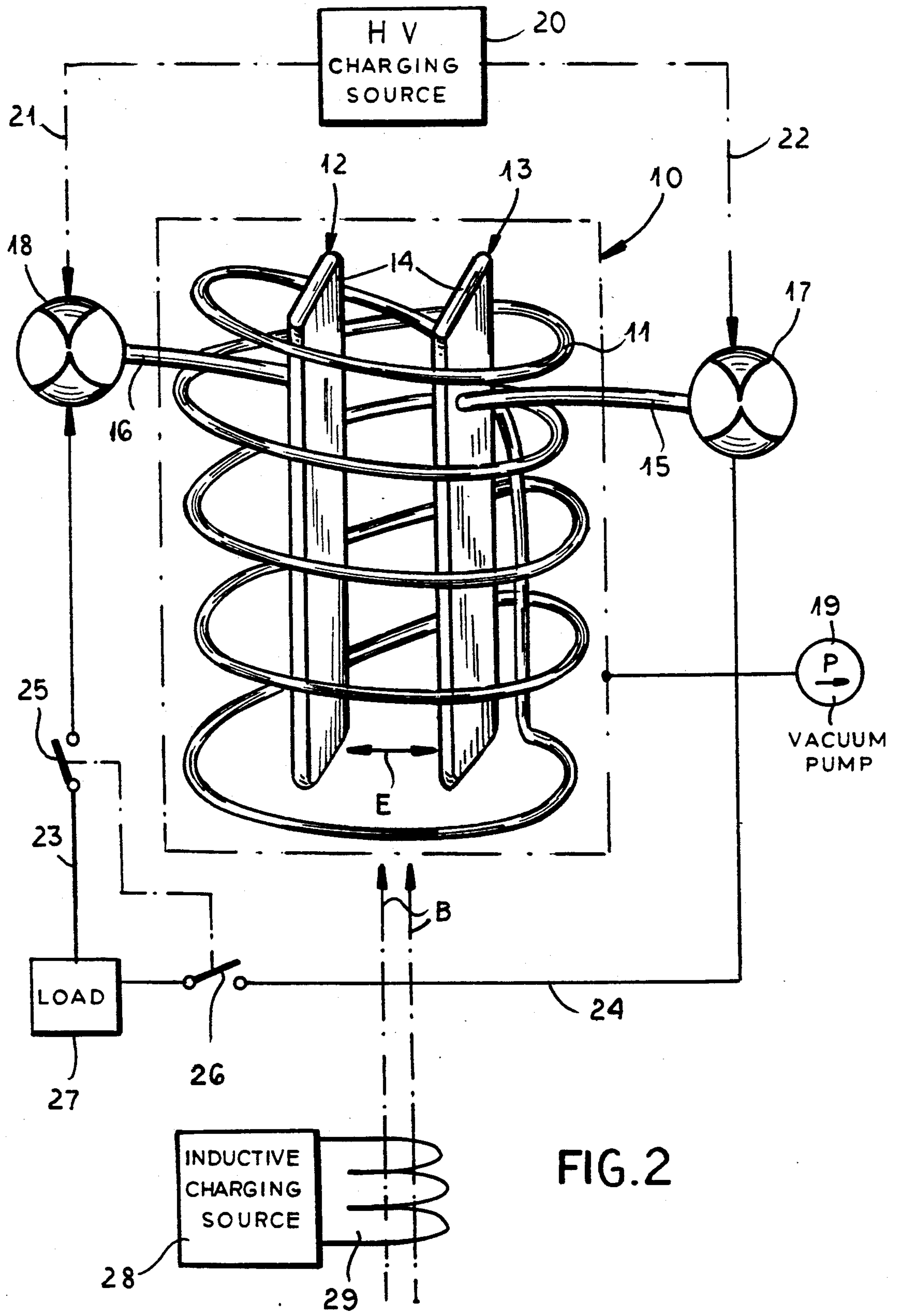
FIG. 2 is a combined diagrammatic perspective view and block diagram of an apparatus in accordance with the invention.

FIG. 2, in highly diagrammatic form, illustrates the principles of the invention in a number of aspects which may not be clear from FIGS. 1*a* and 1*b*.

From FIG. 2 it will be apparent that a housing 10 can be provided for an enclosure which is evacuated by a vacuum pump 19 or otherwise maintained at a substantially reduced subatmospheric pressure, e.g. the pressure in outer space, hereinafter referred to as an extraterrestrial location.

In this housing, two electrically conductive capacitor plates 12 and 13 are spacedly juxtaposed and have rounded edges as represented at 14 to prevent the formation of local zones of high electric field intensity.

Surrounding the plates 12 and 13 is a closed-loop solenoid 11 of a high-critical-temperature superconductor, preferably in the form of a wire and most advantageously in the form of a wire wound in a large number of turns on a supporter such as a glass evacuatable enclosure for the plate 12 and 13 as has been described in connection with FIGS. 1*a* and 1*b*. In FIG. 2, of course, a relatively small number of turns has been illustrated and the turns are unsupported, simply for the sake of explaining the invention in a simplified form. The capacitor plates 12 and 13 are provided with conductive bars or wires 15 and 16 connected to spheres at which an electrical charge can be supplied to the plates or from which an electrical charge can be tapped. The spheres are represented at 17 and 18.

Initially, upon evacuation of the space between the plates to reduce the potential for electrical breakdown, the plates 12 and 13 can be electrically charged from a high-voltage direct-current source 20 connected by conductors 21 and 22 to the balls 17 and 18, for example.

As is well known, in spite of evacuation of the space between the plates, the charge on the plates will eventually dissipate and is limited by the insulating capacity of the space between the plates.

According to the invention, the insulating capacity of the space between the plates which is subjected to a field in the direction of the arrow E because of the charge on the places, is enhanced by applying a magnetic field B in a direction perpendicular to the field E. This magnetic field is generated by the superconductor closed-loop solenoid 11. To induce this magnetic field, I may apply a magnetic field to the solenoid by a coil 29 which is connected to an inductive charging source 28 so that the magnetic field of the coil 29 is coupled to the coil 11 and induces an electric current therein. When the coil 29 and its source 28 is then removed, the solenoid 11 remains charged because of the superconductive effect to maintain the magnetic field B and hence maintain the charge on the capacitor plates until that charge is tapped.

Of course means is provided to cool the solenoid to a temperature below its critical temperature $T_c$ and the magnetic field generated by the coil must be less than the critical magnetic field $H_c$ for superconductivity of the material of the coil.

The critical temperature condition is readily achieved utilizing the aforementioned high critical-temperature superconductive materials when the device illustrated is provided in an extraterrestrial environment, e.g. on a satellite or space station or on a station placed upon another body of the solar system at the appropriate temperature.

Power can be tapped from this system to a load 27 by the closure of switches 25 and 26 connecting the load via conductors 23 and 24 to the balls 17 and 18.

I claim:

1. A method of storing electrical energy for a prolonged period of time, comprising the steps of:

(a) electrically charging a pair of spaced-apart electrically conductive capacitor plates;

(b) positioning a high-critical-temperature superconductor so that upon energization thereof with an electric current a magnetic field is generated between said capacitor plates; and (c) circulating an electric current in said high-critical-temperature superconductor to generate a magnetic field between said capacitor plates of a field strength sufficient to prevent substantial loss of charge therefrom.

2. The method defined in claim 1, further comprising the step of evacuating at least a region between said plates.

3. The method defined in claim 2 wherein said magnetic field is applied in a direction perpendicular an electric field resulting from the electrical charge on said plates across a space between said plates.

4. The method defined in claim 3 wherein said magnetic field is generated by enclosing said capacitor plates in a closed-loop solenoid constituted of turns of a high-critical-temperature superconductor in which an electric current is caused to flow.

5. The method defined in claim 4 wherein said solenoid is maintained at a temperature below the critical temperature of said superconductor by placing said solenoid and said plates in extraterrestrial environment.

6. The method defined in claim 4, further comprising the step of charging said solenoid with said electric current by magnetically inducing flow of said electrical current in said solenoid.

7. The method defined in claim 4 wherein said high-critical-temperature superconductor has a critical magnetic field which is greater than the magnetic field generated by said solenoid.

8. An apparatus for storing electrical energy for a prolonged period of time, comprising:

a pair of electrically charged spaced-apart electrically conductive capacitor plates;

positioning a high-critical-temperature superconductor so that upon energization thereof with an electric current a magnetic field is generated between said capacitor plates; and means for circulating an electric current in said high-critical-temperature superconductor to generate a magnetic field between said capacitor plates of a field strength sufficient to prevent substantial loss of charge therefrom.

9. The apparatus defined in claim 8, further comprising means for evacuating at least a space between said plates.

10. The apparatus defined in claim 9 wherein said magnetic field is applied in a direction perpendicular to an electric field resulting from the electrical charge on said plates across said space between said plates.

11. The apparatus defined in claim 10 wherein said means for generating said magnetic field is a closed-loop solenoid constituted of turns of said high-critical-temperature superconductor traversed by an electric current and in which said capacitor plates are enclosed.

12. The apparatus defined in claim 11 wherein said solenoid is disposed in an extraterrestrial environment and is thereby maintained at a temperature below the critical temperature of said superconductor.

13. The apparatus defined in claim 11, further comprising means for charging said solenoid with said electric current by magnetically inducing flow of said electrical current in said solenoid.

14. The apparatus defined in claim 11 wherein said high-critical-temperature superconductor has a critical magnetic field which is greater than the magnetic field generated by said solenoid.

15. The apparatus defined in claim 11, further comprising a glass chamber within said solenoid enclosing said space and plates and a steel housing enclosing said solenoid and said glass chamber.

16. The apparatus defined in claim 15 wherein said plates have areas of about one square meter and thicknesses of about 7.5 cm and are capable of storing an electrical energy of 4.8 MJ without electrical breakdown upon the development of a vacuum of about $10^{-9}$ Hg and a magnetic field of about 10 Tesla in said space.

17. The apparatus defined in claim 16 wherein said turns are composed of a flexible high-critical-temperature superconductive wire with a cross section of about 1 $cm^2$ capable of carrying a current of about 100,000 amperes/$cm^2$, and said solenoid comprises about 130 turns of said wire with each turn having a length of about 4 m and the solenoid having a total mass of about 312 kg and being able to generate a magnetic field of about 10 Tesla.

18. The apparatus defined in claim 11, further comprising a high-critical-temperature superconductor switch connected to said solenoid to pass an electric current therethrough.

19. The apparatus defined in claim 18 wherein said switch includes a superconductive coil connected in parallel with said solenoid, a current source connected across said coil, a heater juxtaposed with said coil for heating said coil upon energization to generate a resistance in said coil and a voltage thereacross causing current flow in said solenoid, and means for cooling said coil to a superconductive temperature upon deenergization of said heater.

20. The apparatus defined in claim 11 wherein said solenoid comprises a core wire coated with alternating layers of thin high-critical-temperature superconductor film and silver film.

* * * * *